United States Patent
Liu et al.

(10) Patent No.: US 10,403,493 B2
(45) Date of Patent: Sep. 3, 2019

(54) DISPLAY PANEL AND METHOD FOR FORMING MICRO COMPONENT SUPPORT

(71) Applicant: AU Optronics Corporation, Hsin-Chu (TW)

(72) Inventors: Yi-Cheng Liu, Hsin-Chu (TW); Chin-Yuan Ho, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/921,919

(22) Filed: Mar. 15, 2018

(65) Prior Publication Data

US 2018/0366320 A1 Dec. 20, 2018

(30) Foreign Application Priority Data

Jun. 19, 2017 (TW) .............................. 106120422 A

(51) Int. Cl.
| | |
|---|---|
| *G09G 3/32* | (2016.01) |
| *H01L 21/02* | (2006.01) |
| *H01L 21/677* | (2006.01) |
| *H01L 33/00* | (2010.01) |

(52) U.S. Cl.
CPC ......... *H01L 21/02104* (2013.01); *G09G 3/32* (2013.01); *H01L 21/677* (2013.01); *H01L 33/00* (2013.01)

(58) Field of Classification Search
CPC . H01L 21/02104; H01L 21/677; H01L 33/00; G09C 3/32
See application file for complete search history.

(56) References Cited

U.S. PATENT DOCUMENTS

| | | | | |
|---|---|---|---|---|
| 2016/0336488 | A1* | 11/2016 | Bower | .................... H01L 33/20 |
| 2017/0287843 | A1* | 10/2017 | Wu | ................... H01L 23/53266 |

FOREIGN PATENT DOCUMENTS

| | | |
|---|---|---|
| CN | 103915544 A | 7/2014 |
| CN | 203895495 U | 10/2014 |

* cited by examiner

*Primary Examiner* — Thomas M Sember
(74) *Attorney, Agent, or Firm* — WPAT, PC

(57) ABSTRACT

A display panel and a method for forming a micro component support are provided. The method for forming a micro component support includes the following steps. First, a first sacrificial layer is formed on a carrier substrate, where the first sacrificial layer includes a plurality of first openings, and the first openings expose the carrier substrate. Then, a first support layer is formed on the first sacrificial layer and in the first openings. Next, a second sacrificial layer is formed on the first sacrificial layer and the first support layer, where the second sacrificial layer includes a plurality of second openings, and the second openings expose the first support layer. Then, a second support layer is formed on the second sacrificial layer and in the second openings. Next, at least one micro component is formed on the second support layer. Finally, the first sacrificial layer and the second sacrificial layer are removed.

12 Claims, 6 Drawing Sheets

DISPLAY PANEL AND METHOD FOR FORMING MICRO COMPONENT SUPPORT

BACKGROUND

Technical Field

The present invention relates to a display panel and a method for forming a micro component support.

Related Art

A problem that occurs during packaging is usually one of the bottlenecks of mass production of micro components such as semiconductor induction apparatuses, semiconductor laser arrays, micro-electro-mechanical systems (MEMS), and light emitting diode display systems.

In a conventional method for transferring a micro component, a micro component is transferred from a carrier substrate to a receiving substrate by means of wafer bonding. One implementation method of the wafer bonding is direct bonding in which a micro component array is directly bonded from a carrier substrate to a receiving substrate, and then the carrier substrate is removed. Another implementation method of the wafer bonding is indirect bonding in which bonding/splitting needs to be performed twice. During indirect bonding, first, a transfer apparatus extracts a micro component array from a carrier substrate; then, the transfer apparatus bonds the micro component array to a receiving substrate; and finally, the transfer apparatus is removed.

SUMMARY

A technical aspect of the present invention provides a method for forming a micro component support, to improve process yield and process efficiency.

According to an implementation of the present invention, the method for forming a micro component support includes the following steps. First, a first sacrificial layer is formed on a carrier substrate, wherein the first sacrificial layer includes a plurality of first openings, and the first openings expose the carrier substrate. Then, a first support layer is formed on the first sacrificial layer and in the first openings. Next, a second sacrificial layer is formed on the first sacrificial layer and the first support layer, wherein the second sacrificial layer includes a plurality of second openings, and the second openings expose the first support layer. Then, a second support layer is formed on the second sacrificial layer and in the second openings. Finally, the first sacrificial layer and the second sacrificial layer are removed after forming a micro component on the second support layer.

In one or more implementations of the present invention, the method further includes the following steps. First, a transfer apparatus is disposed on the micro component. Then, the transfer apparatus is caused to apply a downforce via the micro component to the second support layer, and to break the first support layer where the first support layer connects to the second support layer.

In one or more implementations of the present invention, the method further includes the following steps. The transfer apparatus drives the micro component, the second support layer, and the break-off part to move downwardly, so that the break-off part is in contact with the carrier substrate, and the second support layer is not in contact with the other part of the first support layer.

According to another implementation of the present invention, a display panel is provided, including: a display substrate, a fixing layer, a support, and a micro component. The fixing layer is disposed on the display substrate. The support includes a platform portion and a plurality of extending portions, where the platform portion is disposed on the fixing layer, and the extending portions extend from the platform portion to the fixing layer. The micro component is disposed on the platform portion.

In one or more implementations of the present invention, each of the extending portions further includes a vertically extending portion and a horizontally extending portion. The vertically extending portion includes a first end and a second end, where the first end is connected to the platform portion, and the horizontally extending portion is connected to the second end.

DETAILED DESCRIPTION

Figure 1:
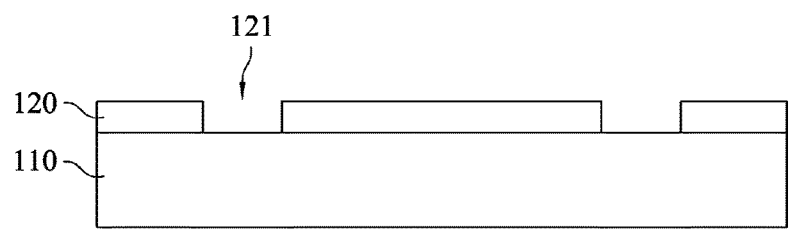
FIG. 1 to FIG. 9 are schematic cross-sectional views of process steps of a micro component support according to an implementation of the present invention.

The following describes a plurality of implementations of the present invention by using drawings. For clarity of illustration, many practical details are described below. However, it should be understood that these practical details should not be construed as a limitation to the present invention. That is, in some implementations of the present invention, these practical details are not necessary. In addition, for simplicity of the drawings, some conventional structures and components are shown in the drawings in a simplified schematic manner.

FIG. 1 to FIG. 9 are schematic cross-sectional views of process steps of a micro component support according to an implementation of the present invention. First, as shown in FIG. 1, a first sacrificial layer 120 is formed on a carrier substrate 110. The first sacrificial layer 120 includes a plurality of first openings 121, and the first openings 121 expose the carrier substrate 110. In other words, the first sacrificial layer 120 does not cover a part of the carrier substrate 110.

For example, the material of the carrier substrate 110 may be glass, silicon, sapphire, or another proper material. The first sacrificial layer 120 may have a single layer or multiple layers, and the material of the first sacrificial layer 120 may be an inorganic material (such as metal), an organic material (such as photoresist), or another proper material. The first sacrificial layer 120 may be formed by using a deposition process, a coating process, or another proper process. The first openings 121 may be formed by using a lithography and etching process, a photolithography process, or another proper process.

Figure 2:
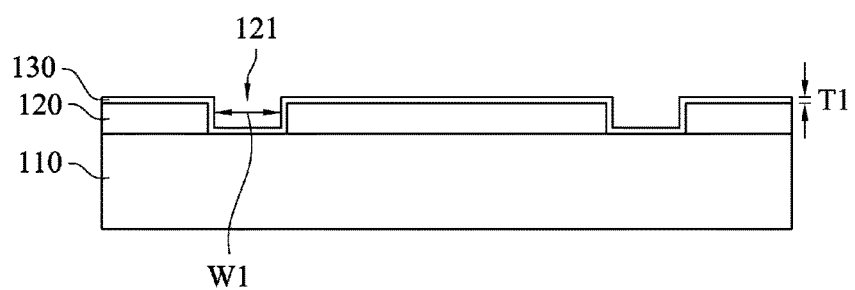

As shown in FIG. 2, a first support layer 130 is formed on the first sacrificial layer 120 and in the first openings 121. For example, the thickness T1 of the first support layer 130 is substantially less than the width W1 of the first opening 121, and the first support layer 130 is conformally formed on the first sacrificial layer 120 and in the first openings 121. Further, because the thickness T1 of the first support layer 130 is substantially less than the width W1 of the first opening 121, the first support layer 130 may be conformally formed in the first openings 121. In this way, it is convenient to use the part that is of the first support layer 130 and that is conformally formed in the first openings 121 as a bracket portion of a support that is formed by using a subsequent process.

In an embodiment, a part of the first support layer 130 is formed on and in contact with the carrier substrate 110, and the other part of the first support layer 130 is formed on and in contact with the first sacrificial layer 120. The first support layer 130 may have a single layer or multiple layers, and the material of the first support layer 130 may be silicon oxide, silicon nitride, amorphous silicon, or another proper material. The first support layer 130 may be formed by using a deposition process or another proper process.

Figure 3:
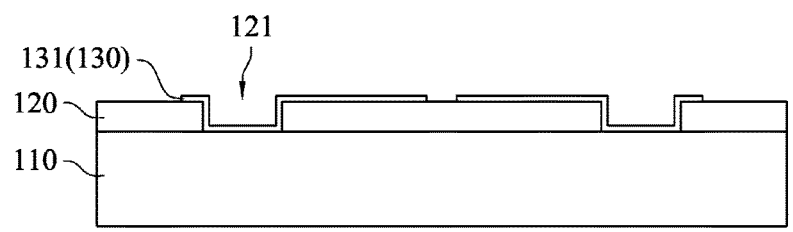

As shown in FIG. 3, the first support layer 130 is patterned, so that the first support layer 130 includes a plurality of first support portions 131. The first support portions 131 are mutually separated (For example, there is a gap not shown that separates two adjacent first support portions 131). A part of each first support portion 131 is respectively disposed in the first openings 121 and on the carrier substrate 110, and the other part of the first support portion 131 is disposed on the first sacrificial layer 120.

Figure 4:
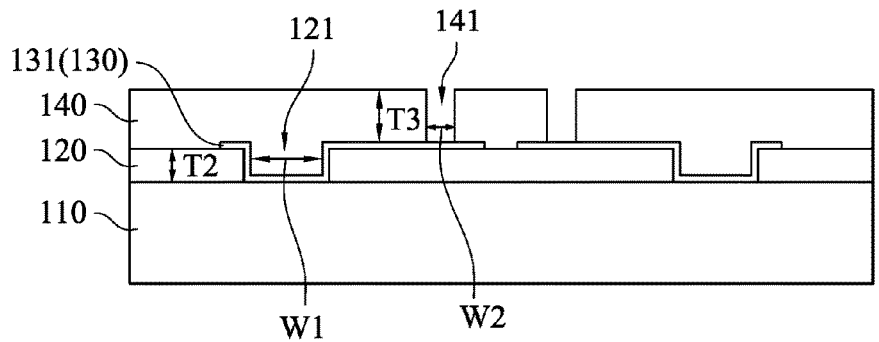

As shown in FIG. 4, a second sacrificial layer 140 is formed on the first sacrificial layer 120 and the first support portions 131 (the first support layer 130). The second sacrificial layer 140 includes a plurality of second openings 141. The second openings 141 expose a part of each first support portion 131 (the first support layer 130). In other words, the second sacrificial layer 140 does not cover the other part of each first support portion 131. For example, the material of the second sacrificial layer 140 may be an inorganic material (such as metal), an organic material (such as photoresist), or another proper material. The second sacrificial layer 140 may be formed by using a deposition process, a photolithography process, or another proper process. The material of the second sacrificial layer 140 may be substantially the same as or different from the material of the first sacrificial layer 120.

An orthographic projection (or referred to as a vertical projection) of each first opening 121 on the carrier substrate 110 and an orthographic projection of each second opening 141 on the carrier substrate 110 are not overlapped.

The width W2 of the second opening 141 is substantially less than the width W1 of the first opening 121, and the thickness T3 of the second sacrificial layer 140 is substantially greater than the thickness T2 of the first sacrificial layer 120. The width W2 of the second opening 141 is substantially less than the width W1 of the first opening 121, so that it is convenient to achieve process integrity.

Figure 5:
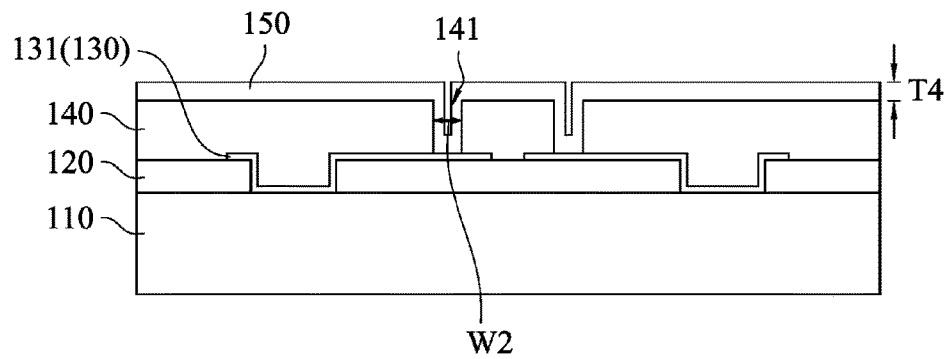

As shown in FIG. 5, a second support layer 150 is formed on the second sacrificial layer 140 and in the second openings 141. For example, the thickness T4 of the second support layer 150 is substantially less than the width W2 of the second opening 141, and the second support layer 150 is conformally formed on the second sacrificial layer 140 and in the second openings 141. Further, because the thickness T4 of the second support layer 150 is substantially less than the width W2 of the second opening 141, the second support layer 150 may be conformally formed in the second openings 141. In this way, it is convenient to use the part that is of the second support layer 150 and that is conformally formed in the second openings 141 as a bracket portion of the support that is formed by using a subsequent process.

In an embodiment, a part of the second support layer 150 is formed on and in contact with the first support portions 131 (the first support layer 130), and the other part of the second support layer 150 is formed on and in contact with the second sacrificial layer 140. The second support layer 150 may include a single layer or multiple layers, and the material of the second support layer 150 may be silicon oxide, silicon nitride, amorphous silicon, metal, or another proper material. The second support layer 150 may be formed by using a deposition process or another proper process.

For example, the thickness T4 of the second support layer 150 is substantially greater than the thickness T1 of the first support layer 130. The thickness T4 of the second support layer 150 is substantially greater than the thickness T1 of the first support layer 130, so that an upper part of the support that is formed by using a subsequent process has relatively great rigidity, and a lower part of the support has relatively small rigidity.

In this implementation, the width W2 of the second opening 141 is only multiple times, for example, two to three times the thickness of the second support layer 150. Therefore, the part of the second support layer 150 that is in the second openings 141 is in a form of a cylinder. In this embodiment, a vertical side wall is used as an example of a side wall of each first opening 121 and/or a side wall of each second opening 141, but this is not limited thereto.

In another embodiment, the side wall of the first opening 121 and/or the side wall of the second opening 141 may be an inclined side, that is, may have a slope.

Figure 6:
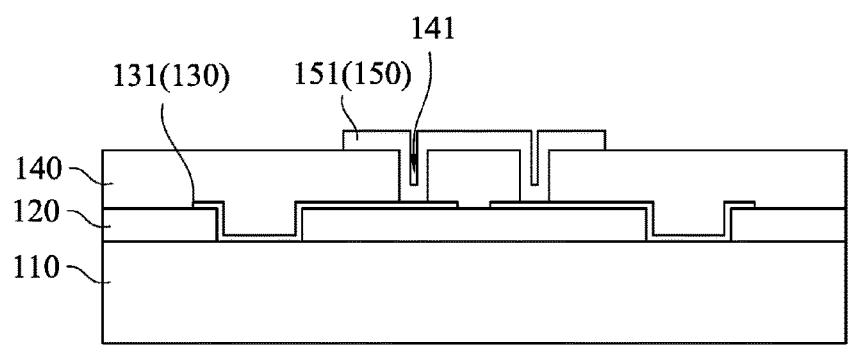

As shown in FIG. 6, the second support layer 150 is patterned, so that the second support layer 150 includes a plurality of second support portions 151. The second support portions 151 are mutually separated. A part of each second support portion 151 is respectively disposed in the second openings 141 and on the first support portions 131, and the other part of the second support portion 151 is disposed on the second sacrificial layer 140.

Further, each second support portion 151 is respectively connected to a plurality of different first support portions 131. In this implementation, each second support portion 151 is connected to two first support portions 131. For example, each second support portion 151 is connected to two adjacent first support portions 131. In other words, each second support portion 151 respectively partially overlaps the two first support portions 131, and each second support portion 151 also partially overlaps a gap (such as a place that is not shown and in which the first support portions 131 are mutually separated) between the two first support portions 131.

Figure 7:
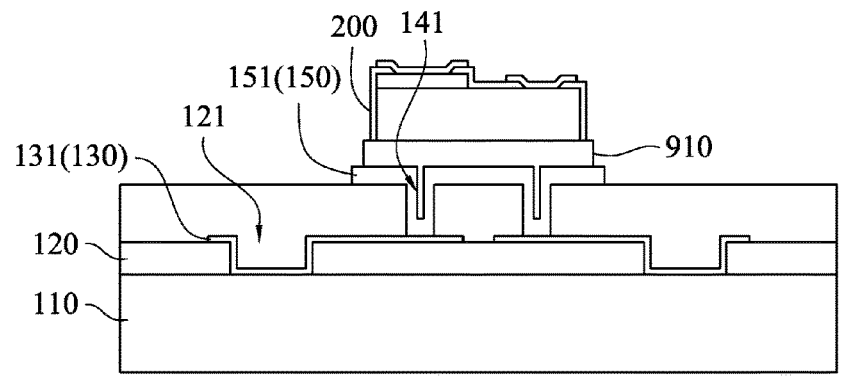

As shown in FIG. 7, at least one micro component 200 is formed on the second support portions 151 (the second support layer 150). Specifically, the micro component 200 is a micro light emitting diode or another proper micro component (such as a photoreceptor, a transistor, or another proper component). In this embodiment, a micro light emitting diode is used as an example of the at least one micro component 200, but this is not limited thereto. Two horizontally arranged electrodes 210 (refer to FIG. 8) that are respectively connected to an electron hole layer (such as a P-type semiconductor or another proper material) and an electron layer (such as an N-type semiconductor or another proper material) are used as an example of the micro light emitting diode, but this is not limited thereto. In another embodiment, the micro light emitting diode includes two vertically arranged electrodes that are respectively connected to an electron hole layer and an electron layer. The photoreceptor may be a visible light photoreceptor, a UV photoreceptor, an IR photoreceptor, or another proper photoreceptor. The transistor may be a bottom-gate transistor, a top-gate transistor, a three-dimensional pass transistor, or another proper transistor. The micro component 200 may be transferred from another substrate (such as a generation substrate) by using a transfer apparatus and fixed on the second support portions 151, but this is not limited thereto. In another embodiment, the micro component 200 may be further directly formed on the second support portions 151.

A part of each second support portion 151 disposed on the second sacrificial layer 140 is in a form of a platform, so that the micro component 200 can be well fixed on the second support portions 151.

In some embodiments, when the micro component 200 is transferred from another substrate (such as a generation substrate) by using a transfer apparatus and fixed on the second support portions 151, before the micro component 200 is fixed, a patterned adhesive layer 910 may be formed on the second support portions 151 (the second support layer 150). Then, the micro component 200 is formed (for example, disposed) on the adhesive layer 910, so that the micro component 200 is fixed on the second support portions 151 (the second support layer 150).

Figure 8:
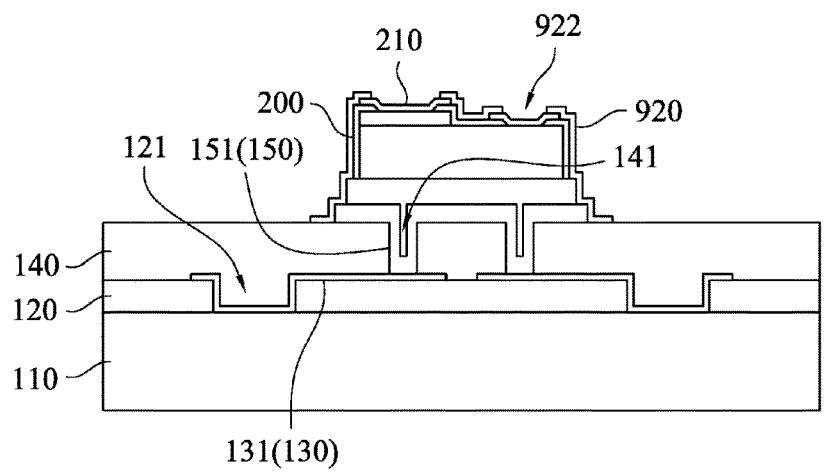

As shown in FIG. 8, an insulating film 920 is deposited and patterned, so that the insulating film 920 covers the micro component 200. When the insulating film 920 is patterned, a contact hole 922 is formed, so that the electrodes 210 of the micro component 200 are exposed. The insulating film 920 may have a single layer or multiple layers, and the material of the insulating film 920 may be silicon oxide, silicon nitride, amorphous silicon, or another proper material.

Figure 9:
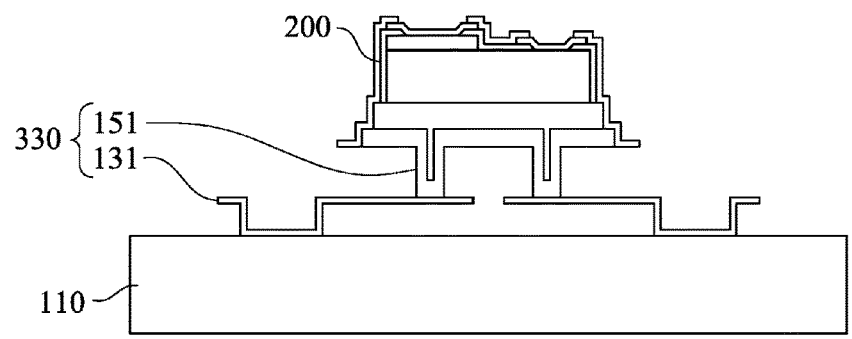

As shown in FIG. 9, the first sacrificial layer 120 and the second sacrificial layer 140 are removed, so that the remaining first support portions 131 and the second support portions 151 form a micro component support 330. The micro component support 330 supports and fixes the micro component 200 onto the carrier substrate 110. The first sacrificial layer 120 and the second sacrificial layer 140 may be removed by using a chemical etching process or another proper process.

In this implementation, two first support portions 131 and one second support portion 151 form one micro component support 330, but this is not limited thereto. In another implementation, more than two first support portions 131 and one second support portion 151 may form one micro component support 330.

Figure 10A:
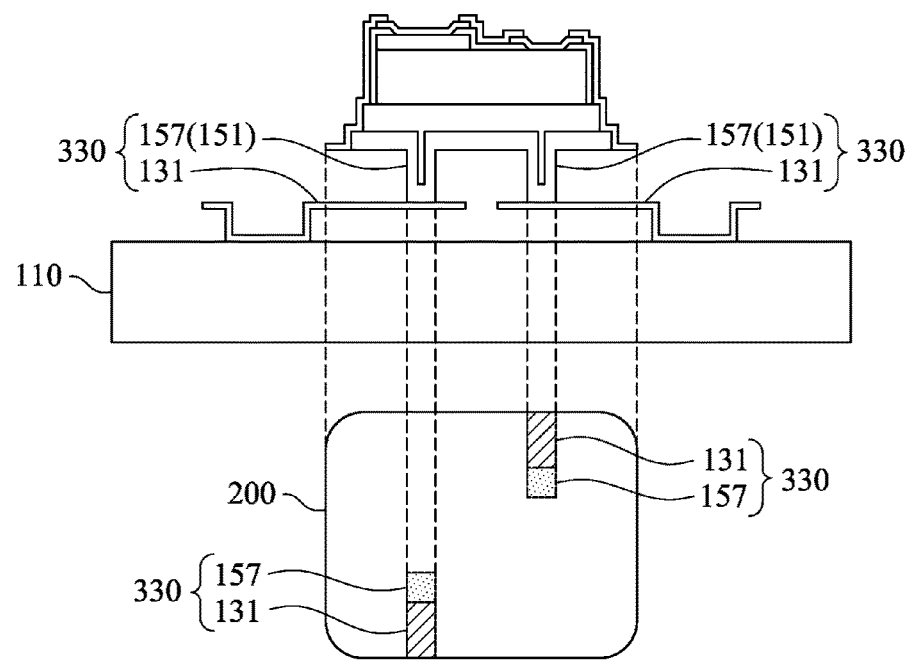
FIG. 10A is a schematic cross-sectional view and a schematic top view of a micro component support according to an implementation of the present invention.

FIG. 10A is a schematic cross-sectional view and a schematic top view of a micro component support 330 according to an implementation of the present invention. As shown in FIG. 10A, a second support portion 151 includes two vertically extending portions 157, and the two vertically extending portions 157 are respectively connected to two first support portions 131. It can be learned from the schematic top view that the two vertically extending portions 157 are respectively and roughly disposed at two opposite angles or on a diagonal path of the micro component 200. The two second support portions 151 are also respectively and correspondingly disposed at two opposite angles or on a diagonal path of the micro component 200. It should be noted herein that only a contour of the micro component 200 is shown in the schematic top view, and a detailed structure is not shown.

Figure 10B:
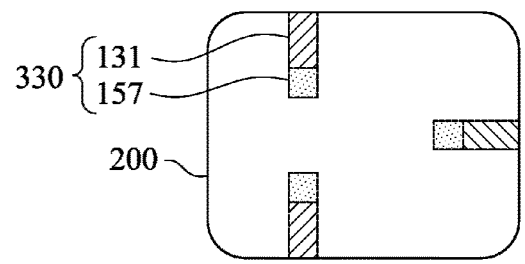
FIG. 10B and FIG. 10C are schematic top views of a micro component support according to different implementations of the present invention.
Figure 10C:
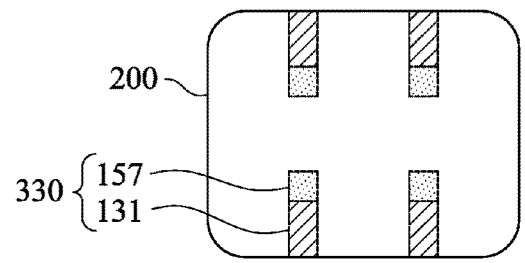

FIG. 10B and FIG. 10C are schematic top views of a micro component support 330 according to different implementations of the present invention. As shown in FIG. 10B and FIG. 10C, the micro component support 330 does not necessarily include only two vertically extending portions 157 and two first support portions 131. In FIG. 10B, the micro component support 330 includes three vertically extending portions 157 and three first support portions 131. The three vertically extending portions 157 are respectively connected to the three first support portions 131. The three vertically extending portions 157 are respectively disposed on locations that are adjacent to two opposite sides of the micro component 200 and a location that is adjacent to an adjacent side that connects the two opposite sides, and the adjacent side is an adjacent side that is of two adjacent sides connecting the two opposite sides and that is remoter relative to the vertically extending portions 157 that are disposed adjacent to the two opposite sides. The three vertically extending portions 157 are respectively and correspondingly disposed on locations that are adjacent to the two opposite sides of the micro component 200 and a location that is adjacent to an adjacent side that connects the two opposite sides.

In FIG. 10C, the micro component support 330 includes four vertically extending portions 157 and four first support portions 131. The four vertically extending portions 157 are respectively connected to the four first support portions 131. The four vertically extending portions 157 are respectively and roughly disposed at four corners of the micro component, and the four second support portion 151 are also respectively and correspondingly disposed at the four corners of the micro component 200, but this is not limited thereto. In another embodiment, two of the four vertically extending portions 157 are disposed adjacent to one of the two opposite sides of the micro component 200, and the other two vertically extending portions 157 are disposed adjacent to the other of the two opposite sides of the micro component 200.

In the foregoing architecture, the micro component support 330 includes multiple branches that are connected to the micro component 200 and the carrier substrate 110 (refer to FIG. 10A), so that the micro component 200 is prevented from falling off from the carrier substrate 110.

Further, due to the setting of the locations of the vertically extending portions 157 and the first support portions 131, weight of the micro component 200 may be evenly distributed by using the micro component support 330, so that the micro component 200 can be well fixed on the carrier substrate 110.

Figure 11:
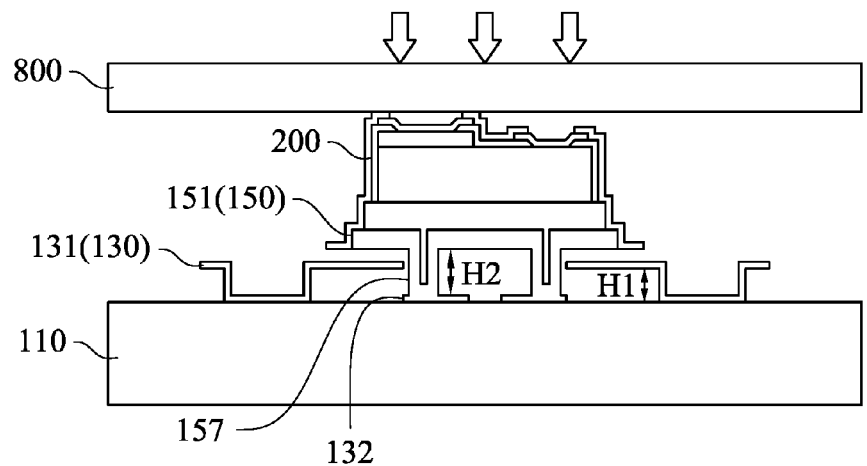
FIG. 11 to FIG. 13 are schematic cross-sectional views of process steps of transferring a micro component according to an implementation of the present invention.
Figure 12:
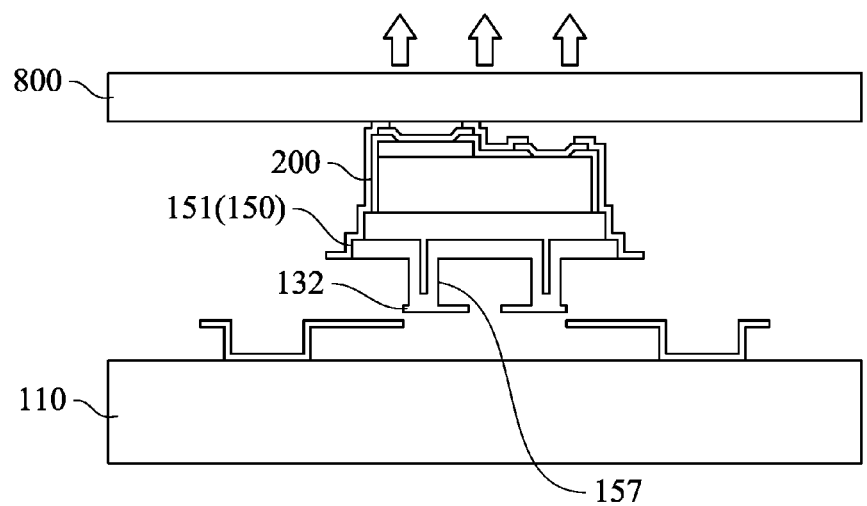
Figure 13:
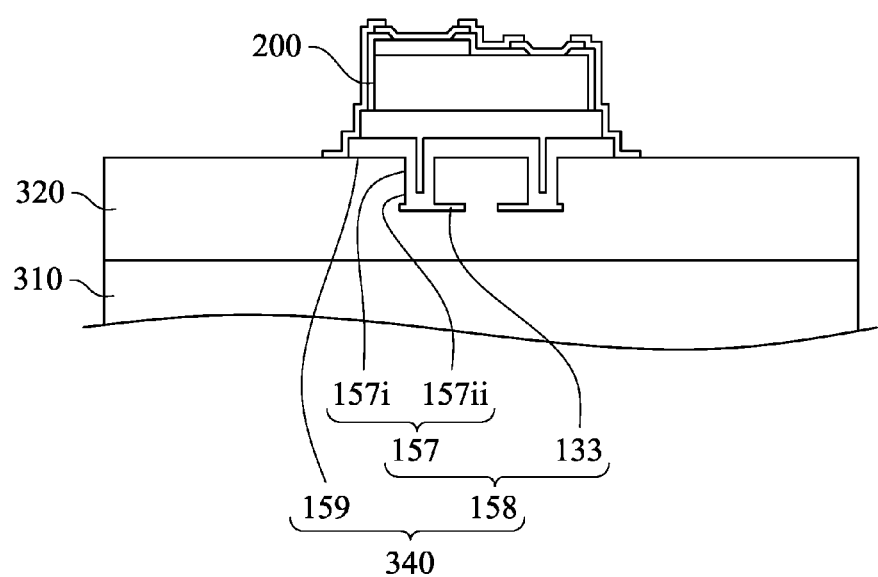

FIG. 11 to FIG. 13 are schematic cross-sectional views of process steps of transferring a micro component 200 according to an implementation of the present invention. First, as shown in FIG. 11, a transfer apparatus 800 is disposed on the micro component 200. Then, the transfer apparatus 800 is caused to apply a downward pressure (such as a pressure or a thrust formed by the transfer apparatus 800 moving toward an inner surface of a carrier substrate 110) via the micro component 200 to a second support portions 151 (a second support layer 150), and a break-off part 132 that is of a first support portion 131 (a first support layer 130) and that is connected to the second support portion 151 (the second support layer 150) is caused to break off from the other part of the first support portion 131 (the first support layer 130). For example, the break-off part 132 is adjacent to a gap (not shown) between two first support portions 131 or adjacent to a neighboring place of the gap, but this is not limited thereto.

In another embodiment, the break-off part 132 may be further another location that is prone to break-off.

It should be noted that the transfer apparatus 800 herein needs to apply only a downward pressure (or referred to as a downforce) to the micro component 200, and does not need to apply a horizontal force for a rightward or leftward displacement, so that the micro component 200 is prevented from being displaced, tilted, or falling off.

After the break-off part 132 of the first support portion 131 breaks off from the other part of the first support portion 131, the transfer apparatus 800 drives the micro component 200, the second support portion 151 (the second support layer 150), and the break-off part 132 (a part of the first support portion 131) to move downwardly, so that the break-off part 132 is in contact with the carrier substrate 110.

As shown in FIG. 4 and FIG. 11, because the orthographic projection of the first opening 121 on the carrier substrate 110 and the orthographic projection of the second opening 141 on carrier substrate 110 are not overlapped, an orthographic projection on the carrier substrate 110 of the first support portion 131 formed in the first opening 121 and an orthographic projection on the carrier substrate 110 of the vertically extending portion 157 of the second support portion 151 formed in the second opening 141 are not overlapped. In this way, the break-off part 132 that is connected to the vertically extending portion 157 is suspended, and there is a gap between the break-off part 132 and the carrier substrate 110. When the transfer apparatus 800 applies a downward pressure via the micro component 200 to the second support portion 151, because the break-off part 132 is suspended, the break-off part 132 breaks off from the other part of the first support portion 131, and the micro component 200, the second support portion 151 and the break-off part 132 (a part of the first support portion 131) move downwardly. In this way, the break-off part 132 is in contact with the carrier substrate 110.

Further, because the thickness T3 of the second sacrificial layer 140 is substantially greater than the thickness T2 of the first sacrificial layer 120, the height H2 of the vertically extending portion 157 of the second support portion 151 is caused to be substantially greater than the height H1 of the first support portion 131. In this case, when the break-off part 132 is in contact with the carrier substrate 110, the second support portion 151 (the second support layer 150) is in contact with only the break-off part 132, and is not in contact with the other part of the first support portion 131 (the first support layer 130).

As shown in FIG. 12, the transfer apparatus 800 extracts the micro component 200, and extracts, at the same time, the second support portion 151 and the break-off part 132 that are connected to the micro component 200.

As shown in FIG. 13, the transfer apparatus 800 (refer to FIG. 12) places the micro component 200 on a fixing layer 320 of a display substrate 310 (or referred to as a receiving substrate). In this case, an adhesive force of the fixing layer 320 is substantially greater than an attraction force (or referred to as an adhesive force) of the transfer apparatus 800 on the micro component 200. Therefore, after the micro component 200 is placed on the fixing layer 320, the micro component 200 adheres to the fixing layer 320 and falls off from the transfer apparatus 800.

As shown in FIG. 11, for the second support portion 151 and the break-off part 132 that are connected to the micro component 200, only the break-off part 132 is in contact with the carrier substrate 110, and a contact area between the break-off part 132 and the carrier substrate 110 is not large. Therefore, it is not necessary to worry that after being in contact for an excessively long period, the break-off part 132 and the carrier substrate 110 are electrostatically attracted to each other and then the micro component 200 cannot be extracted from the carrier substrate 110. Therefore, on the foregoing premise, the transfer apparatus 800 does not need to apply a relatively great downforce to reduce a time of contact between the break-off part 132 and the carrier substrate 110, and the micro component 200 can be prevented from being damaged because of an excessively great downforce.

Further, in the foregoing architecture, the contact area between the break-off part 132 and the carrier substrate 110 is not large, so that a tool that has a relatively small line width does not need to be changed to specially to reduce the contact area between the break-off part 132 and the carrier substrate 110. Therefore, for the entire process, a requirement for constructing multiple components is avoided, so that process yield and process efficiency can be further improved.

As shown in FIG. 13, another implementation of the present invention provides a display panel 300. The display panel 300 includes: a display substrate 310, a fixing layer 320, at least one support 340, and at least one micro component 200. The fixing layer 320 is disposed on the display substrate 310. The support 340 includes a platform portion 159 and a plurality of extending portions 158. The platform portion 159 is disposed on the fixing layer 320, and the extending portions 158 extend from the platform portion 159 to the fixing layer 320. The micro component 200 is disposed on the platform portion 159.

The material of the fixing layer 320 may be an organic material (such as photoresist). It should be noted that the foregoing specific implementation of the fixing layer 320 is merely an example, and is not intended to limit the present invention. A person of ordinary skill in the technical field to which the present invention belongs should select a specific implementation of the fixing layer 320 according to an actual requirement.

Each extending portion 158 further includes a vertically extending portion 157 and a horizontally extending portion 133. The vertically extending portion 157 includes a first end 157i and a second end 157ii. The first end 157i is connected to the platform portion 159 and the horizontally extending portion 133 is connected to the second end 157ii.

In some embodiments, the width of the vertically extending portion 157 is substantially greater than the thickness of the horizontally extending portion 133, and the length of the vertically extending portion 157 is substantially greater than the thickness of the horizontally extending portion 133. It should be noted that the foregoing specific implementations of the vertically extending portion 157 and the horizontally extending portion 133 are merely examples, and are not intended to limit the present invention. A person of ordinary skill in the technical field to which the present invention belongs should select specific implementations of the vertically extending portion 157 and the horizontally extending portion 133 according to an actual requirement.

In some embodiments, the thickness of the platform portion 159 is substantially greater than the thickness of the horizontally extending portion 133, and the thickness of the platform portion 159 is substantially less than the width of the vertically extending portion 157. It should be noted that the foregoing specific implementations of the platform portion 159, the horizontally extending portion 133, and the vertically extending portion 157 are merely examples, and are not intended to limit the present invention. A person of ordinary skill in the technical field to which of the present invention belongs should select specific implementations of the platform portion 159, the horizontally extending portion 133, and the vertically extending portion 157 according to an actual requirement.

In some embodiments, the length of vertically extending portion 157 is substantially greater than the width of the vertically extending portion 157. It should be noted that the foregoing specific implementation of the vertically extending portion 157 is merely an example, and is not intended to limit the present invention. A person of ordinary skill in the technical field to which the present invention belongs should select a specific implementation of the vertically extending portion 157 according to an actual requirement.

A type of the micro component 200 in this embodiment may be the same as that described above in the foregoing embodiment, and details are not described herein again.

In the foregoing implementation of the present invention, because the micro component support includes multiple branches that are connected to the micro component and the carrier substrate, the micro component is prevented from falling off from the carrier substrate.

Further, for a second support portion and a break-off part that are connected to the micro component, only the break-off part is in contact with the carrier substrate, and a contact area between the break-off part and the carrier substrate is not large. Therefore, it is not necessary to worry that after being in contact for an excessively long period, the break-off part and the carrier substrate are electrostatically attracted to each other and then the micro component cannot be extracted from the carrier substrate. Therefore, on the foregoing premise, a transfer apparatus does not need to apply a relatively great downforce to reduce a time of contact between the break-off part and the carrier substrate, so that the micro component can be prevented from being damaged because of an excessively great downforce.

Further, in the foregoing architecture, the contact area between the break-off part and the carrier substrate is not large, so that a tool that has a relatively small line width does not need to be changed to specially to reduce the contact area between the break-off part and the carrier substrate. Therefore, for the entire process, a requirement for constructing multiple components is avoided, so that process yield and process efficiency can be further improved.

Although the present invention has been disclosed by using the implementations, the implementations are not intended to limit the present invention, and a person skilled in the art may make various modifications and improvements without departing from the spirit and scope of the present invention. Therefore, the protection scope of the present invention should be subject to the scope defined by the claims.

What is claimed is:

1. A method for forming a micro component support, comprising:
   forming a first sacrificial layer on a carrier substrate, wherein the first sacrificial layer comprises a plurality of first openings, and the first openings expose the carrier substrate;
   forming a first support layer on the first sacrificial layer and in the first openings;
   forming a second sacrificial layer on the first sacrificial layer and the first support layer, wherein the second sacrificial layer comprises a plurality of second openings, and the second openings expose the first support layer;
   forming a second support layer on the second sacrificial layer and in the second openings; and
   removing the first sacrificial layer and the second sacrificial layer after forming a micro component on the second support layer.

2. The method according to claim 1, wherein the second opening is narrower than the first opening.

3. The method according to claim 1, wherein the second sacrificial layer is thicker than the first sacrificial layer.

4. The method according to claim 1, wherein the second support layer is thicker than the first support layer.

5. The method according to claim 1, wherein a thickness of the second support layer is less than a width of the second opening.

6. The method according to claim 1, wherein a thickness of the first support layer is less than a width of the first opening.

7. The method according to claim 1, wherein the step of forming the first support layer further comprises:
   patterning the first support layer to form a plurality of first support portions, wherein the first support portions are mutually separated, and each of the first support portions is corresponding and disposed in each of the first openings.

8. The method according to claim 1, wherein the first openings and the second openings do not overlap.

9. The method according to claim 1, wherein the step of forming the first support layer further comprises: forming the first support layer on the carrier substrate via the first openings.

10. The method according to claim 1, wherein the step of forming the second support layer further comprises: forming the second support layer on the first support layer via the second openings.

11. The method according to claim 10, further comprising:
    disposing a transfer apparatus on the micro component; and
    causing the transfer apparatus to apply a down force via the micro component to the second support layer, and to break the first support layer where the first support layer connects to the second support layer.

12. The method according to claim 11, further comprising:
    driving, by the transfer apparatus, the micro component, the second support layer, and a first break-off part to move downwardly, wherein the first support layer is broken into the first break-off part and a second break-off part, the first break-off part is in contact with the carrier substrate, and the second support layer is not in contact with the second break-off part of the first support layer.

* * * * *